United States Patent [19]
Morrison

[11] Patent Number: 5,451,947
[45] Date of Patent: Sep. 19, 1995

[54] MODULATED DITHER SIGNAL

[75] Inventor: Gary Morrison, Le Touvet, France

[73] Assignee: Schlumberger Industries S. A., Montrouge, France

[21] Appl. No.: 200,613

[22] Filed: Feb. 23, 1994

[30] Foreign Application Priority Data

Feb. 26, 1993 [EP]  European Pat. Off. ............ 93400496

[51] Int. Cl.⁶ ............................................. H03M 1/20
[52] U.S. Cl. ...................................... 341/131; 341/155
[58] Field of Search ........................ 341/118, 131, 155

[56] References Cited

U.S. PATENT DOCUMENTS

| | | | |
|---|---|---|---|
| 2,669,608 | 2/1954 | Goodall | 179/43.5 |
| 3,877,022 | 4/1975 | Lehman et al. | 341/131 |
| 4,187,466 | 2/1980 | Kasson et al. | 325/42 |
| 4,965,668 | 10/1990 | Abt et al. | 358/160 |
| 5,073,778 | 12/1991 | Ueki et al. | 341/131 |
| 5,189,418 | 2/1993 | Bartz et al. | 341/131 |

FOREIGN PATENT DOCUMENTS

| | | |
|---|---|---|
| 0037259 | 3/1980 | European Pat. Off. . |
| 0181719 | 10/1984 | European Pat. Off. . |
| 0225641 | 5/1986 | European Pat. Off. . |

*Primary Examiner*—Marc S. Hoff
*Attorney, Agent, or Firm*—Sanford J. Asman

[57] ABSTRACT

A system for analogue to digital conversion comprising a means (4) for receiving an input analogue signal, a dither generator for adding a dither signal and an analogue to digital converter (2) for converting the combined input signal and dither signal to a digital value, characterized in that the dither generator provides a dither signal of a form comprising a first periodic dither signal having superimposed and being shaped by a second signal having at least one component which varies the first periodic dither signal over at least one quantization interval of the analogue to digital converter.

10 Claims, 5 Drawing Sheets

MODULATED DITHER SIGNAL

The present invention relates to a system for analogue to digital conversion comprising a means for receiving an input analogue signal, a dither means for adding a dither signal and an analogue to digital converter for converting the combined input signal and dither signal to a digital value.

Application of a dither or QED (Quantisation Error Dispersion) signal to an analogue signal prior to conversion to a digital value is a well-known signal processing technique for overcoming the limitations of the resolution of a particular analogue to digital converter. The limit of resolution of a converter is generally fixed by the spacing between levels of the converter. For example, for a typical analogue to digital converter, an analogue signal falling between two adjacent levels or steps of the converter will always be converted to the lower digital value. Thus a quantisation error is introduced as different analogue values falling within this interval will all give rise to the same digital value. Improving the resolution of the converter by increasing the number of levels reduces this error but is a complicated and costly way of doing this. Furthermore, for some applications, digital conversion of signals of quite different magnitudes may be necessary and, for low magnitude signals, variations of interest in the signal may still lie between two levels of the converter.

Addition of a dither signal, such as a ramp signal or a white noise signal, to the input signal prior to digital conversion provides one way of compensating for these quantisation errors. Consider, for example, the case of an analogue signal being of a value of exactly half a quantisation level. If no dither signal is applied, the converter will output the lower digital value at all times. However, if a rising ramp signal of a magnitude equal to one quantisation interval is added to the input signal prior to conversion, the magnitude of the combined signal will remain below the next threshold for half the time, of the ramp but will rise above the next threshold for the other half of the time such that the converter will output the lower quantisation level for half the time and the upper level for the other half of the time. Averaging the output of the converter over the ramp time will thus give a value corresponding to the average of the two quantisation levels, i.e. the actual value of the input analogue signal.

Such signal processing techniques have been widely developed in a number of different applications, such as image processing, communications systems and metering technologies, and using various dither signals such as periodic ramp signals or non-periodic white noise. See, for example, U.S. Pat. No. 4,187,466, EP 0 047 090 or EP 0 181 719.

A particular problem rises where a periodic dither signal, such as a periodic triangular ramp signal, is used (as opposed to a white noise dither signal). In order to completely suppress any quantisation error, the dither signal should extend over an exactly integral number of quantisation intervals. If not, an error, the magnitude of which will depend on the amplitude of the input signal, will still be introduced. For example, consider the case of a periodic dither signal having a peak to peak amplitude not equal to an integral number of quantisation intervals, that is, having a peak value which falls between two quantisation levels. For measurements around this peak, the digital output of the converter will not accurately reflect the amplitude of the input signal and, indeed, the output will not distinguish between some input signal magnitudes. In contrast, for a dither signal of integral number of quantisation intervals, the digital output will vary with and proportionally reflect the analogue input. However, in view of the non-linearities and uncertainties in the quantisation level spacing for an analogue to digital converter together with variations in component tolerances and temperature drifts it is difficult to ensure that the dither signal conforms to this strict criterion and such residual quantisation errors are usually unavoidable.

The present invention is characterised in that the dither means provides a dither signal of a form comprising a first periodic dither signal being shaped by a second signal having at least one component which varies the first periodic dither signal over at least one quantisation interval of the analogue to digital converter.

This second dither signal is effective to compensate for any differences between the peak to peak amplitude of the first dither signal and an integral number of quantisation intervals as the position of the maximum and/or the minimum peak of the dither signal in relation to the position of a quantisation level will be varied over at least one quantisation interval such that any residual quantisation errors dependent on the signal magnitude will be removed or at least substantially reduced.

In one embodiment, the second dither signal may be represented as a white noise signal having a peak to peak amplitude of greater than one quantisation interval of the digital converter. For example, a white noise signal having an amplitude standard deviation of plus or minus half a quantisation level may be used. With the normal distribution for a white noise signal, the maximum amplitude will be plus or minus one and a half quantisation intervals, this giving a peak to peak amplitude of 3 quantisation intervals.

Superposition of such a noise signal over the periodic first dither signal will act to vary the peak values of the dither signal. However, preferably, the second dither signal is represented by a second periodic signal, for example, of a lower frequency than the first periodic dither signal such that the maximum or minimum peaks of the first periodic signal may vary slowly in time by the magnitude of at least one quantisation interval. Use of a second periodic signal enables the composite dither signal to be controlled in a known manner to provide optimum compensation. The first dither signal may comprise a triangular ramp signal.

In one embodiment, the second periodic signal may be a simple rising and falling ramp signal, of a peak to peak magnitude greater than one quantisation interval of the analogue to digital converter, added to the first periodic dither signal to introduce a drift in the total dither signal. This embodiment suffers from the disadvantage, however, that a low frequency component corresponding to the ramp frequency will be introduced. As will be discussed below, the frequencies of the signals introduced can be important in some further preferred embodiments.

In a particularly preferred embodiment, the second periodic signal comprises a modulation signal defining a modulation envelope for the first dither signal, the upper and lower boundaries of the modulation envelope each varying with a magnitude of greater than one quantisation interval of the analogue to digital converter. Such an envelope is easily generated and avoids the problems of introduction of unwanted frequency components associated with use of a ramp as the second dither signal.

Preferably, the combined dithered signal is of a form comprising a first triangular ramp signal modulated by a second modulation signal, the upper and lower boundaries of the envelope varying with a magnitude of greater than one quantisation interval. In order to generate such a signal the dither means may conveniently comprise a means for generating a pulse width modulated signal, a means for generating a square wave, integrating means for integrating the pulse width modulation signal to generate the upper and lower boundaries of a modulation envelope, means for modulating the square wave by this envelope, and means for integrating the modulated square wave to produce a modulated triangular ramp signal. In a practical embodiment, a pulse width modulated signal and a square wave can be usually provided by a port of a microprocessor chip. The remaining components required for integration may comprise easily available and inexpensive capacitors and resistors and a simple IC component can be used to effect modulation of the square wave. Thus, this embodiment provides an inexpensive and easily realisable means to produce a combined dither signal according to the present invention.

In alternative embodiments, the first periodic signal may assume other forms such as, for example, a repeating up ramp signal (rather than a triangular ramp) or any other convenient dither signal.

Advantageously, the amplitude of the first periodic signal may be greater than a plurality of quantisation intervals of the analogue to digital converter. Use of a large scale dither signal enables minimisation of any non-linearity quantisation errors introduced by variations in the spacing of an individual quantisation level by enabling averaging over a plurality of such levels. The contribution of any non-linearity in the spacing of one particular quantisation interval is thus reduced. Combined with a second superimposed signal as defined above to remove any residual signal dependant quantisation errors associated with the first dither signal, this embodiment provides a particularly accurate means for reducing quantisation errors and increasing the resolution of the analogue to digital converter. In such a embodiment, a second periodic signal of a range of similar magnitude may also be superimposed such that the peak to peak value of the first signal may vary from effectively zero to its maximum. However, modulating the first dither signal in this way somewhat reduces the effectiveness of the large scale first dither signal to reduce non-linearity quantisation errors, as the peak to peak magnitude of the first signal will be reduced for a great deal of the time. Thus, preferably, the combined signal comprises a first periodic signal of a magnitude of relatively large number of quantisation intervals, and a second superimposed signal of a relatively small number of quantisation intervals. This provides a balance between the effects of the first signal in reducing non-linearity quantisation errors and the second signal in reducing residual signal dependant quantisation errors.

For example, using a modulated dither signal with an analogue to digital converter of 256 levels, the dither signal may comprise a ramp of around 60 intervals modulated by an envelope, the upper and lower boundaries of which vary by 4 intervals.

The present invention is particularly applicable to the field of measurement of values of an a.c. varying power supply and in one embodiment, extends to a metering apparatus including a sensor means for providing an analogue signal representative of the voltage or current of an a.c. supply and a system for analogue to digital conversion of that signal as described above. The field of a.c. power measurement is one example where signal strengths, such as measured current, may vary over a wide range of values, and the present invention is particularly useful in facilitating accurate measurement of such values whilst minimising the number of bits required in a converter.

Advantageously, the metering apparatus may further comprise a first high frequency filter connected between the sensor means and the dither means, the frequency of the first periodic dither signal being set at a, value above the cut-off frequency, and in which a second high frequency filter is applied at the output of the analogue to digital conversion to reduce or eliminate the first periodic dither signal. This embodiment enables the effects of the dither signal to be filtered out. As discussed above, selection of a modulation waveform for the second dither signal in one preferred embodiment means that no further frequency signals need be introduced into the frequency band of interest.

In one embodiment, the analogue to digital converter operates at a sampling frequency to sample values to be converted, the first cut-off filter being set at a value below half the sampling frequency, i.e. the Nyquist frequency, and the frequency of the first periodic signal being set at a value between the cut-off frequency of the first high frequency filter and half the sampling frequency, the output filter comprising a decimation means arranged after the analogue to digital converter to sum subsequent digitally converted values. As will be explained in more detail below in relation to the preferred embodiment, fixing the sampling frequency and the dither frequency in this manner has the effect that two immediately subsequent digitally converted values will correspond to converted analogue values of the input signal plus a first dither increment and of the input signal minus a second dither increment, where the first and second increments are extremely close. Accordingly, addition of two adjacent values leaves only a small residual incremental value plus a value corresponding to twice the input signal, such that the dither signal is effectively subtracted leaving an enhanced input signal prior to any further operations. In alternative embodiments the output filter may be omitted.

Preferably, the metering apparatus or conversion system includes an integrator or accumulator means to sum the digitally converted values corresponding to the power associated with converted voltage and current values.

There will now be described, by way of example only, embodiments of the invention with reference to the accompanying figures, in which.

Figure 1:
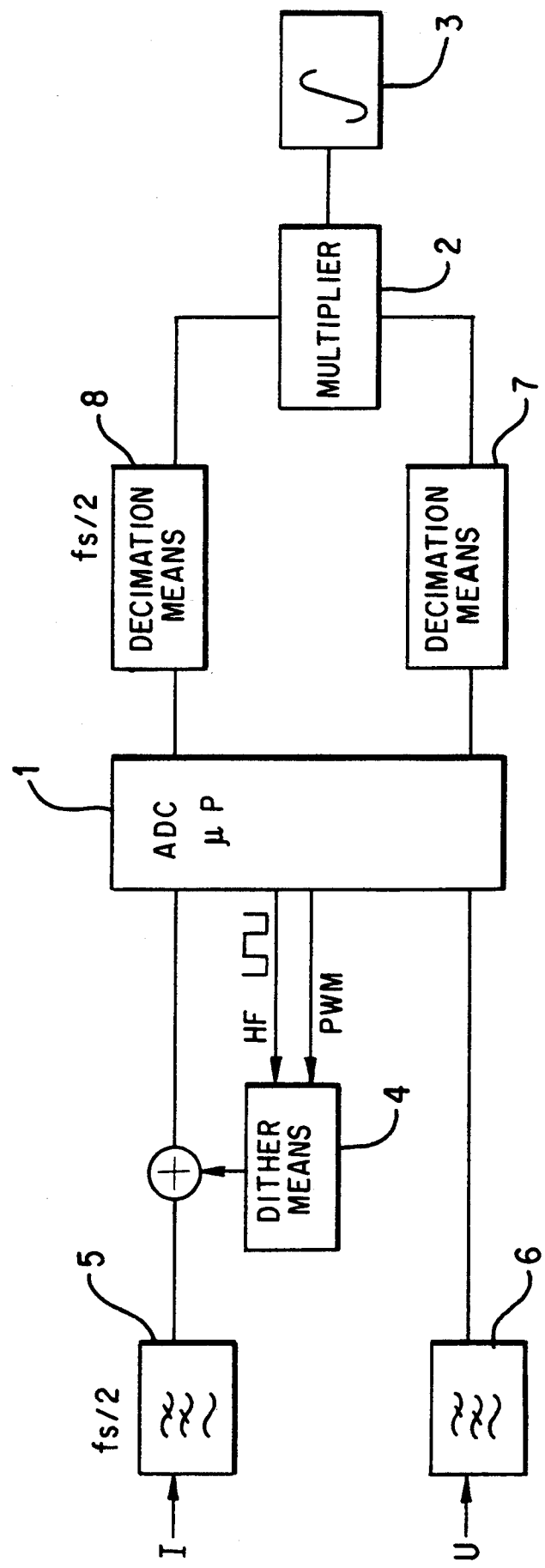
FIG. 1 shows a metering apparatus including an analogue to digital conversion system using a dither signal according to one embodiment of the invention.

FIG. 1 shows a metering apparatus for calculating the energy taken from an a.c. supply comprising an analogue to digital converter 1 for converting the analogue measured current and voltage values to digital values, a multiplier 2 for multiplying these values together and an integrator or accumulator 3 for integrating the instantaneous energy value over a period of time. The converter 1 samples analogue values at a fixed sampling rate and converts these values to digital values depending on their position in relation to a nearest lowest quantisation level. The apparatus also includes a dither means 4 for adding a dither signal to the analogue current value before digital conversion, high frequency filters 5 and 6 having a cut-off frequency at below half the sampling frequency of the analogue to digital converter and decimation means 7 and 8 which operate as a high frequency filter.

Input current and voltage measurements are taken by conventional devices, such as a current shunt or a voltage divider circuit, and the current and voltage signals I and U are then passed through high frequency anti-aliasing filters which filter out all signals above half the sampling frequency of the analogue to digital converter, but which leave the a.c. supply frequencies of interest. Typically, for an a.c. supply of 50 Hz, the sampling frequency of the converter used in this embodiment will be of the order of 4,250 Hz, with the filters 5 and 6 having a cut-off below 2,125 Hz, the cut off point being defined for the filters as the point which an input amplitude is attenuated by a factor of two. Prior to conversion by the converter 1, a dither signal is added to the analogue current signal by the dither means 4. In this particular embodiment, it is only the current signal that is dithered, in view of the wide range of possible values that this might assume. In contrast, the voltage may be assumed to be generally constant. However, in alternative embodiments, the voltage signal U may also be injected with a dither signal.

In this embodiment, the signal being dithered is an a.c. varying signal. As will be discussed below, the main frequency of the dither signal and the sampling frequency of the converter used are considerably greater than the frequency of the supply, such that dithering (and averaging by subsequent integration) over a full range of the dither signal effectively operates on a constant input value and such that the dither frequencies are distinguishable from the a.c. frequencies of interest.

Figure 3:
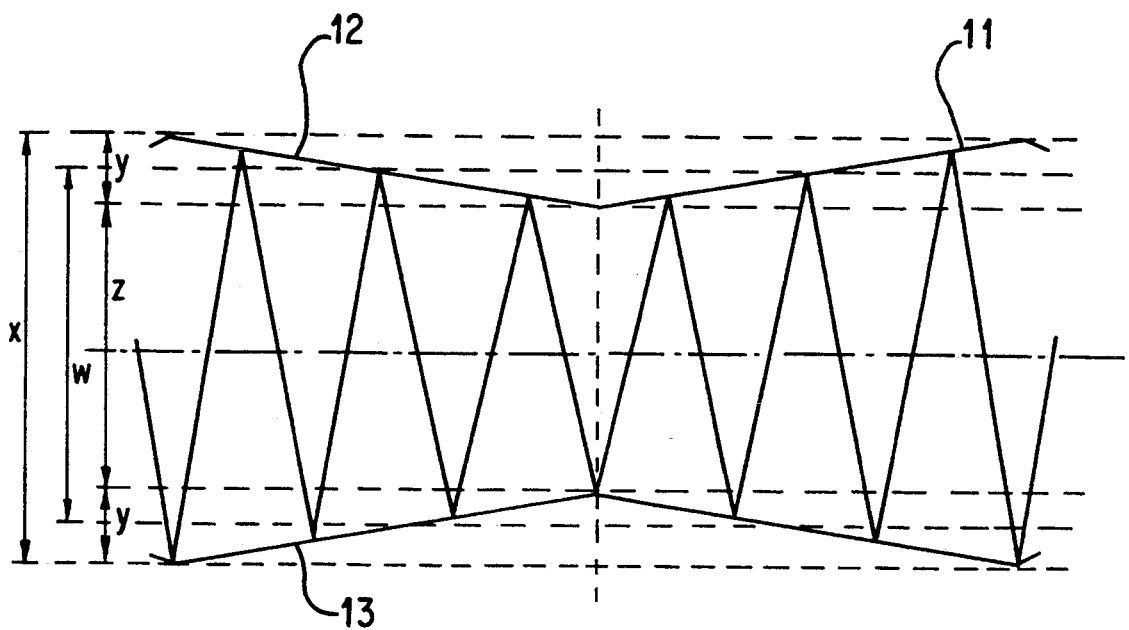
FIG. 3 shows the dither signal generated by the means of FIG. 2.

Conventionally, the dither signal injected at this point comprises a simple triangular ramp signal or similar. However, as discussed in the introduction, such dither signals give rise to errors in view of the difficulty in ensuring that the dither signal extends across exactly an integral number of quantisation levels. In contrast, the present invention utilises a dither signal comprising a first periodic dither signal having superimposed and being shaped by a second dither signal. In the present embodiment, and as illustrated in FIG. 3, the compound dither signal comprises a first high frequency triangular ramp signal 10 modulated by a second lower frequency dither signal 11. For an analogue to digital converter of 256 quantisation intervals, the triangular ramp signal 10 may be set at a maximum peak to peak amplitude w quantisation intervals, whilst the modulation envelope includes upper and lower band components 12 and 13 each modulating the triangular dither signal 10 over a value y corresponding to at least one quantisation interval of the analogue to digital converter. The variation in the position of the peak values of the ramp signal 10 introduced by this modulation overcomes the requirement that the ramp extend over exactly an integral number of quantisation intervals.

Figure 5A:
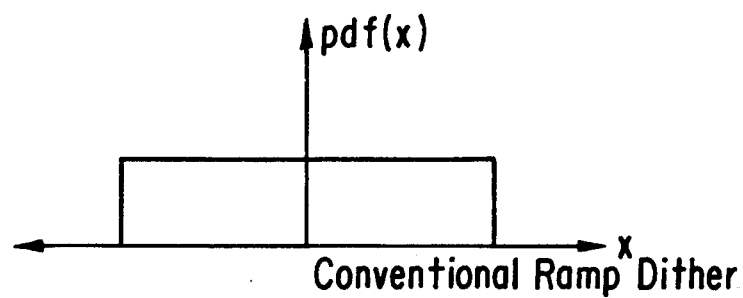
FIG. 5 shows the probability distribution of a conventional single periodic dither signal compared with the probability distribution of the dither signal of FIG. 3.
Figure 5B:
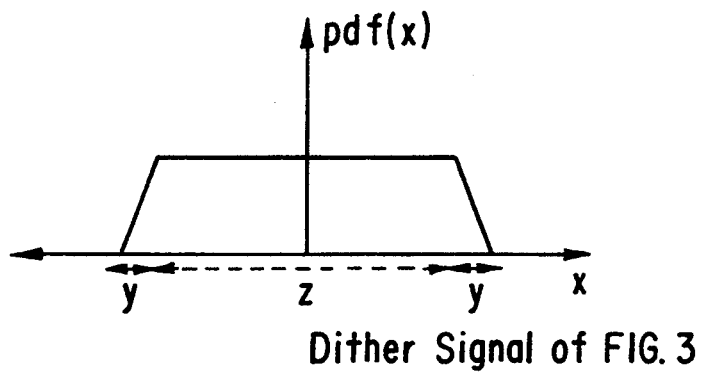

The resultant probability function of the modulated signal of FIG. 3 compared with conventional triangular ramp signals is illustrated in FIG. 5 of the drawings. The upper figure represents the probability distribution of a conventional triangular ramp signal in which the ramp has uniform amplitude probability density function, that is, the probability of the signal being found at a particular value within its range is the same for all values. In contrast, the probability distribution for the dither signal of the present embodiment decreases towards the edges of the range, due to the effects of the modulation envelope.

Figure 4:
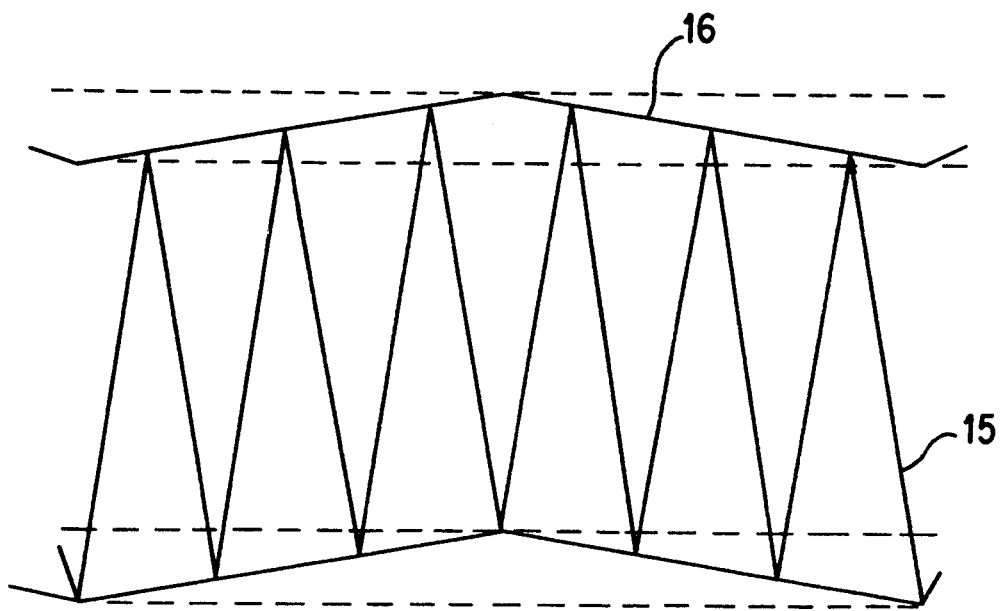
FIG. 4 shows an alternative dither signal which may be used according to the present invention.

An alternative embodiment having the same amplitude probability density function is shown in FIG. 4 in which a triangular ramp signal 15 has a second triangular ramp signal 16 added to it to vary the position of the upper and lower peaks. This embodiment suffers from the disadvantage that a further frequency element, corresponding to the frequency of the second ramp 16 is introduced into the signal band of interest. In other embodiments, the first dither signal may be only modulated by one component acting on the upper peak of the ramp signal. In yet further embodiments, the second superimposed dither signal may be a white noise signal of a standard deviation of at least plus or minus half a quantisation interval.

Referring to FIG. 3, the embodiment shown uses a triangular ramp signal 10 set at a maximum peak to peak value w of 60 quantisation intervals, with a modulation envelope having upper and lower band components 12 and 13 modulating the ramp signal over a value y equal to 4 quantisation intervals. Thus, the combined signal has a peak to peak value varying from a minimum z at 56 quantisation intervals to a maximum x at 64 quantisation intervals. The relative amplitudes of the first and second dither signals are chosen as providing a reasonable correction by the second signal of the residual quantisation errors when the peak to peak value of the first dither signal is not equal to an integral number of quantisation intervals whilst allowing effective compensation of non-linearities of the quantisation levels by the first ramp signal. As discussed in the introduction, use of a ramp signal extending over a large number of quantisation intervals facilitates compensation of non-linearities of quantisation levels falling within this band. Increasing the amplitude of the modulation components reduces this compensation effect, but increases the compensation for residual signal dependant quantisation errors.

Figure 7:
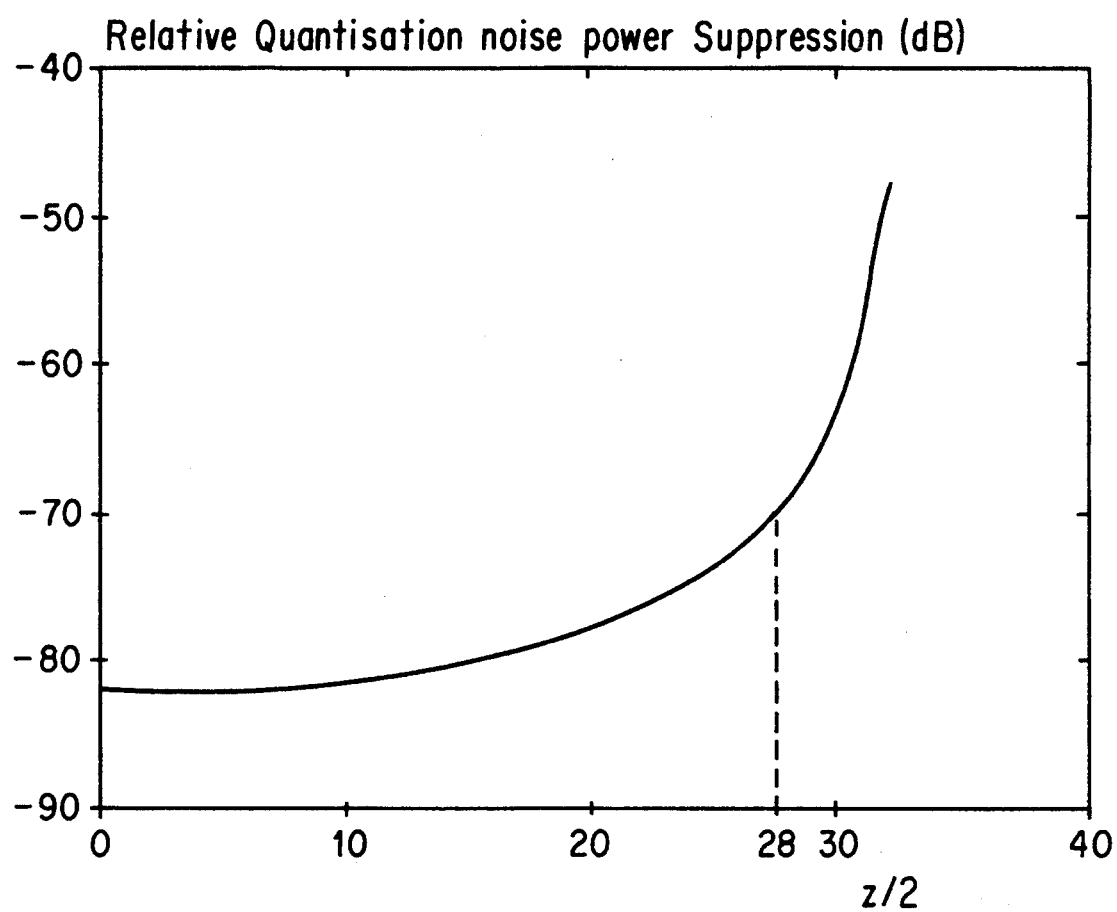
FIG. 7 shows the relative quantisation noise power suppression as a function of the relative magnitudes of the first and second dither signals.

Referring to FIG. 7, there is shown a graph indicating the relative quantisation noise suppression of residual quantisation errors versus the value z/2, where z is shown in FIG. 3. As shown, the noise suppression is worst at z/2=32 (which corresponds to a conventional ramp signal with no modulation) and best at z/2=0 (which corresponds to a moduation in which the modulation envelope reduces the ramp signal to zero at its minimum). However, the improvement in compensation for such residual errors rapidly decreases as z/2 approaches zero and any such gains are outweighed by the reduction in effectiveness of the ramp signal to compensate for non-linearities. Accordingly, in the embodiment of FIG. 3 the value z/2 is set at 28, which provides a reasonable balance between the two.

Figure 2:
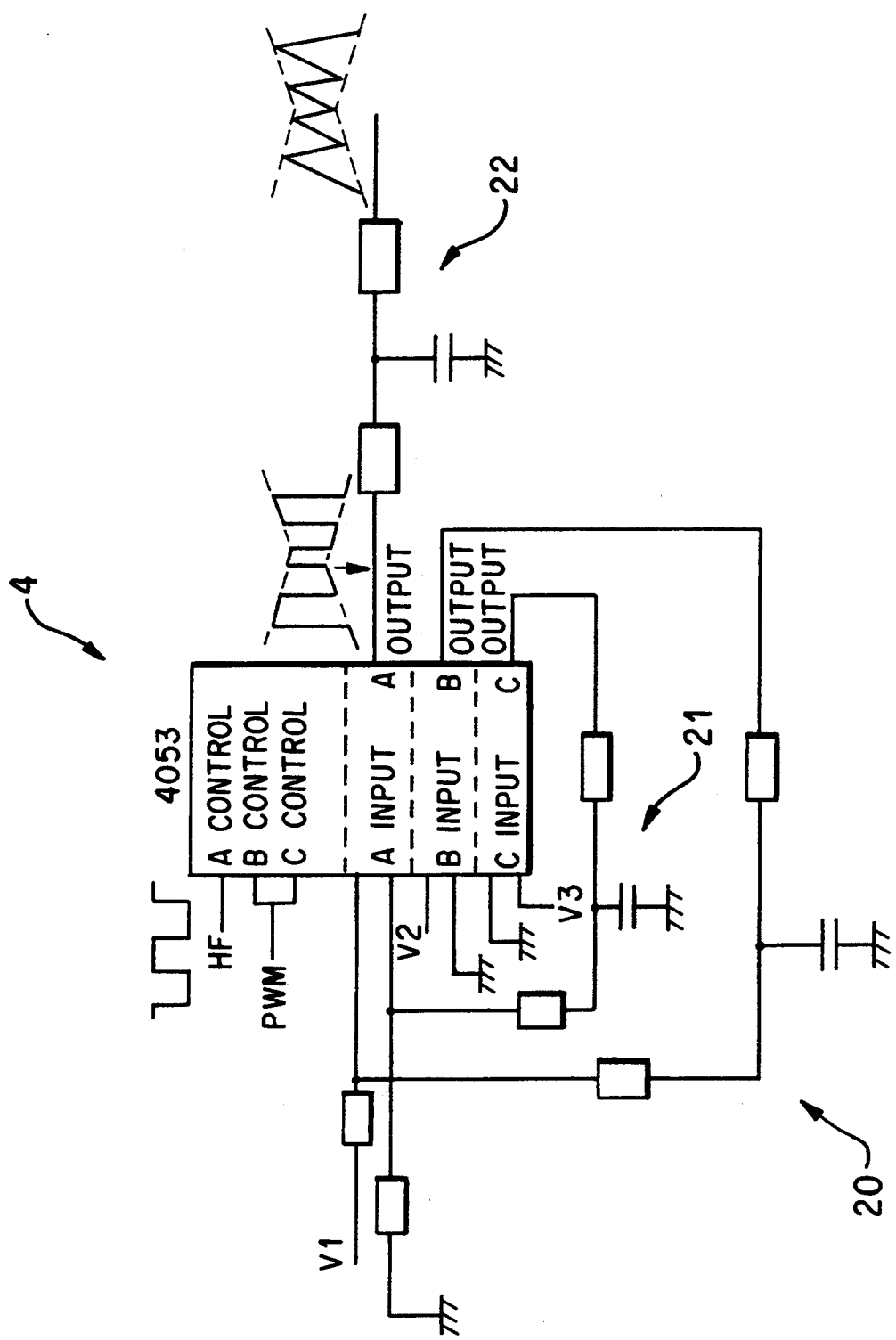
FIG. 2 shows in detail the means for generating the dither signal used in the metering apparatus of FIG. 1.

Referring to FIG. 2, there is shown a means 4 for generating the dither signal of FIG. 3 comprising a standard 3 switch 4053 IC component fed with a high frequency square wave HF and a Pulse Width Modulated signal PWM from the microprocessor and associated integrating means 20, 21 and 22, each including 2 resistors in series and a capacitor connected on the one side to the ground and on the other side between the 2 resistors. The 4053 IC is a standard component in which signals on control lines A, B and C control the output appearing on the corresponding output lines, switched between either of the associated inputs lines. For example, the square wave HF at control line A switches the input between V1 and earth (the inputs being further modulated by the outputs of the pulse width modulated signals). Similarly, the pulse width modulated signals at control lines B and C will cause V2 or earth and V3 or earth to appear at the outputs B and C respectively.

Pulse width modulated signals are, of course, well-known in the art and may be represented by a duty signal of alternately increasing and decreasing duty ratio. For example, for a 16 bit PWM signal, the output will be high for 1/16th of the total pulse length, then for 2/16th of the pulse length, 3/16th etc. After a peak is reached, the duty ratio then slowly decreases. In the present embodiment the pulse width signal PWM at control lines B and C causes pulse width modulated signals of magnitude V2 and V3 to appear at the outputs B and C, respectively. Relative inversion of the voltage inputs at B and C to earth means that the pulse width signal at B increases whilst C decreases and vice versa.

Integration of the pulse width modulated outputs B and C by the integrating means 21 and 22 produces opposing rising and falling ramp signals. The integrating means may simply comprise a capacitor and resistor arrangement as shown. These rising and falling ramp signals define the upper and lower bands of a modulating envelope and modulate the inputs V1 and earth as applied to the input A. As discussed, the high frequency square wave HF at control line A controls the switching between V1 and earth, such that a modulated square wave appears at the output A. This modulated square wave may then be simply integrated to produce the modulated triangular ramp signal shown in FIG. 3

Referring to FIG. 1, the filters 5 and 6 introduce a cut-off frequency of a value below half the sampling frequency (the Nyquist frequency) of the converter at 2,125 Hz. The frequency of the ramp component is chosen to be above the cut-off frequency and below half the sampling frequency. The relative values of each frequency may be chosen according to the implementation. Typically, the ramp dither frequency will be a few Hertz below the Nyquist frequency, whilst each branch of the modulating envelope typically has a frequency less than a Hertz. Use of a modulation envelope, rather than a ramp signal (as shown in FIG. 4) means that no unwanted frequency components will appear in the signal band of intrest from this modulating signal.

Figure 6:
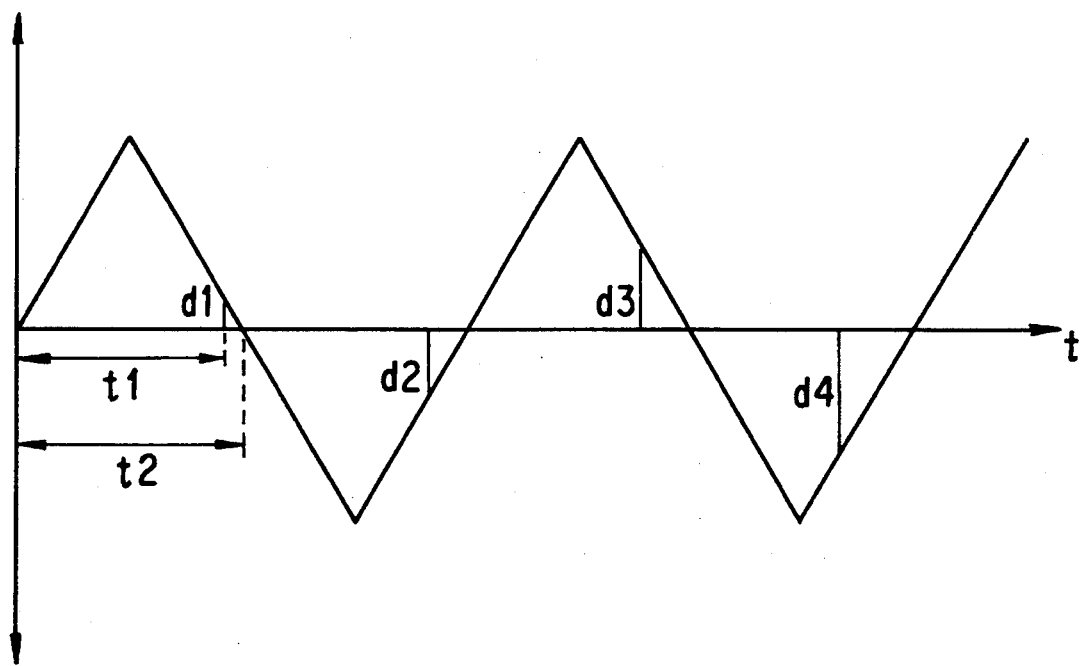
FIG. 6 shows, by way of illustration of the decimation process, the effects of sampling a ramp signal, where the ramp signal is chosen to have a frequency at just below half the sampling frequency.

FIG. 6 shows the effects of choosing a ramp signal of just under half the sampling frequency of the analogue to digital converter. The effects are shown in relation to a non-modulated ramp signal but extend in the same manner to a modulated signal. The ramp signal is such that a half period t2 is just greater than the sampling period t1 of the converter. Thus, the first sample at t1 will include a small positive value d1 of the dither, the second sample a slightly larger negative value d2, then a slightly larger positive value d3 and then a slightly larger negative value d4, and so on. These dither values are added to the analogue input I of the current and converted. The output of the converter then comprises a frequency spectrum having the digitally converted a.c. current value at 50 Hz and the dither signal (including any quantisation errors) at a frequency close to half the sampling frequency. In order to subtract the dither signal after conversion, the embodiment further comprises digital decimation means which effectively sum together adjacent sampled values. Referring to FIG. 6, the first digital value will correspond to the converted value I+d1, whilst the second will correspond to I−d2. Addition of these two values results in the value 2I−(d2−d1). Assuming d1 and d2 are of similar magnitude the converted value d2−d1 will be negligible. Provided that the relative frequencies of the converter and the ramp signal have been chosen correctly the contribution of the residual amounts will vary between zero and one quantisation level, according to the relative position of subsequent values to the nearest quantisation steps. Hence the decimation means effectively filters out or at least greatly attenuates the dither noise signal and gives a current signal of double magnitude, but half frequency.

Decimation is also carried out on the converted voltage signal U in order to maintain the relative phase between the current and voltage. Although the decimination means 7 and 8 have been shown as seperate logical elements, in practice these functions may be carried out by the microprocessor. Other decimation techniques are possible, for example, by summing weighted values of three or more adjacent digital outputs.

After decimation, the converted voltage and current signals are passed to a conventional multiplier circuit 2 and then to an integrator or accumulator 3 to total the energy consumed. Any noise signal remaining from the decimation process will comprise a square wave of relatively low frequency. The actual frequency of the square wave will depend on the ramp amplitude, the ramp frequency, the sample frequency and the quantisation interval size but should be generally much less than the frequency of the a.c. supply. The magnitude of this square wave will be equal to one quantisation level. Integration over a period of time will thus also cancel the effect of any residual noise, any positive contribution by a dither signal to the running total being cancelled by an opposing negative contribution of equal value. For a given magnitude of an input signal, the digital output after substraction over the range of the first dither signal will correspond to a sequence of values, varying in magnitude by approximately one quantisation level, the average value of which corresponds to the actual input signal.

In practice, it is possible to eliminate the decimation step and to average converted current values including an added component varying over the full range of the periodic first dither signal. For a given input signal the digital output of the analog to digital converter comprises the input signals, the quantisation noise, and the dither components located between the filter cut-off frequency and the Nyquist frequency. As the input amplitude information is statistically uncorrelated to the dither components in the digital signal, the digital current signal could be used directly to calculate the energy. In such a case, a relatively longer integration time is required.

I claim:

1. A system for analog to digital conversion comprising a means for receiving an input analog signal, a dither means for adding a dither signal and an analog to digital converter for converting the combined input signal and dither signal to a digital value, characterized in that the dither means provides a dither signal of a form comprising a first periodic dither signal comprising a rising and falling ramp signal being shaped by a second signal having at least one component which varies the first periodic dither signal over at least one quantization interval of the analog to digital converter.

2. The system of claim 1, in which the second signal is a second periodic signal.

3. The system of claim 2, in which the second signal comprises a modulation signal defining a modulation envelope for the first dither signal, the upper and lower boundaries of the modulation envelope each varying with a magnitude greater than at least one quantization interval of the analogue to digital converter.

4. The system of claim 1, in which the first dither signal is a triangular ramp signal.

5. The system of claim 1, in which the dither means comprises a means for generating a pulse width modulated signal, a means for generating a square wave, integrating means for integrating the pulse width modulation signal to generate the upper and lower boundaries of a modulation envelope, means for modulating the square wave by this envelope, and means for integrating the modulated square wave to produce a modulated triangular ramp signal as the dither signal.

6. The system of claim 1, in which the amplitude of the first dither signal is greater than a plurality of quantization intervals of the analog to digital converter.

7. The system of claim 6, in which the first dither signal is of a magnitude of a relatively large number of intervals and the magnitude of the at least one component of the second dither signal is of a relatively smaller number of quantization intervals.

8. A metering apparatus for measuring values of an a.c. power supply comprising:
   (a) a sensor means for providing an analog signal representative of the voltage or current of an a.c. supply; and
   (b) an analog to digital converter for converting said analog signal, said analog to digital converter comprising a means for receiving an input analog signal, a dither means for adding a dither signal and means for converting the combined input signal and dither signal to a digital value, said dither means adapted to provide a dither signal of a form comprising a first periodic dither signal having a rising and falling ramp signal being shaped by a second signal having at least one component which varies the first periodic dither signal over at least one quantization interval of said analog to digital converter.

9. The metering apparatus of claim 8 further comprising a first high frequency filter connected between the sensor means and the dither means of the converter system, and in which the frequency of the first periodic dither signal is set at a value above the cut-off frequency, and a second high frequency filter is applied at the output of the analog to digital converter to reduce or eliminate the first periodic dither signal.

10. The metering apparatus of claim 9, in which the analog to digital converter operates to sample values at a predetermined sampling frequency, the cut-off frequency of the first high frequency filter being set at a value below half the sampling frequency and the frequency of the first periodic signal being set at a value between the cut-off frequency of the first high frequency filter and half the sampling frequency, and the output filter comprises decimation means arranged after the analogue to digital converter to sum subsequent digitally converted values.

* * * * *